(12) United States Patent
Hoffmann et al.

(10) Patent No.: US 7,045,408 B2
(45) Date of Patent: May 16, 2006

(54) INTEGRATED CIRCUIT WITH IMPROVED CHANNEL STRESS PROPERTIES AND A METHOD FOR MAKING IT

(75) Inventors: Thomas Hoffmann, Portland, OR (US); Chris Auth, Portland, OR (US); Mark Armstrong, Portland, OR (US); Stephen Cea, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 110 days.

(21) Appl. No.: 10/443,152

(22) Filed: May 21, 2003

(65) Prior Publication Data

US 2004/0235236 A1 Nov. 25, 2004

(51) Int. Cl.
*H01L 21/8238* (2006.01)
*H01L 21/84* (2006.01)
*H01L 21/00* (2006.01)
*H01L 21/461* (2006.01)
*H01L 21/31* (2006.01)

(52) U.S. Cl. ............... 438/199; 438/763; 438/744; 438/158

(58) Field of Classification Search ............ 438/199, 438/763, 744, 141, 158, 283, 380, 740
See application file for complete search history.

(56) References Cited

U.S. PATENT DOCUMENTS

| 5,633,202 | A | 5/1997 | Brigham et al. ............ 438/763 |
|---|---|---|---|
| 6,228,777 | B1 | 5/2001 | Arafa et al. ............... 438/740 |
| 6,372,569 | B1 * | 4/2002 | Lee et al. ................... 438/229 |
| 6,638,807 | B1 * | 10/2003 | Forbes et al. ............... 438/236 |
| 6,762,085 | B1 * | 7/2004 | Zheng et al. ............... 438/199 |
| 2002/0113295 | A1 * | 8/2002 | Nakamura .................. 257/640 |

* cited by examiner

*Primary Examiner*—Chuong Anh Luu
(74) *Attorney, Agent, or Firm*—Rahul D. Engineer

(57) ABSTRACT

An integrated circuit is described that comprises a PMOS transistor and an NMOS transistor that are formed on a semiconductor substrate. A silicate glass layer is formed on only the PMOS transistor or the NMOS transistor; and an etch stop layer is formed on the silicate glass layer. Also described is a method for forming an integrated circuit. That method comprises forming a PMOS transistor structure and an NMOS transistor structure on a semiconductor substrate, forming a silicate glass layer on only the PMOS transistor structure or the NMOS transistor structure, and forming an etch stop layer on the silicate glass layer.

12 Claims, 2 Drawing Sheets

_US 7,045,408 B2_

INTEGRATED CIRCUIT WITH IMPROVED CHANNEL STRESS PROPERTIES AND A METHOD FOR MAKING IT

FIELD OF THE INVENTION

The present invention relates to integrated circuits and a method for making them.

BACKGROUND OF THE INVENTION

A transistor may include borderless contacts to reduce the distance between devices. To prevent the unlanded contact etch step (which precedes the contact deposition step) from etching into an adjoining isolation structure, an etch stop layer may be formed on the surface of the device prior to performing that etch step. When the etch stop layer is blanket deposited over an entire CMOS device, it covers both the NMOS transistors and the PMOS transistors.

The etch stop layer may apply a tensile or compressive stress to each transistor's channel. That stress may enhance or degrade the transistor's performance, depending on the type of transistor. For example, when the etch stop layer is a silicon nitride layer that is in tension, it may enhance the performance of an NMOS transistor (e.g., by improving charge carrier mobility and velocity in the channel region, which increases the transistor's drive current), but degrade the performance of a PMOS transistor. Conversely, when the etch stop layer is in compression, it may enhance the performance of a PMOS transistor, but degrade the performance of an NMOS transistor.

Accordingly, there is a need for an integrated circuit with an etch stop layer that enhances the performance of a transistor having one conductivity type without significantly degrading the performance of a transistor having the opposite conductivity type. The present invention provides such a device, and a method for making it.

DETAILED DESCRIPTION OF THE PRESENT INVENTION

An improved integrated circuit and method for making it are described. The integrated circuit comprises a PMOS transistor and an NMOS transistor that are formed on a semiconductor substrate, and a silicate glass layer that is formed on only the PMOS transistor or the NMOS transistor. An etch stop layer is formed on the silicate glass layer. In the method of the present invention, a silicate glass layer is formed on only a PMOS transistor structure or an NMOS transistor structure; and an etch stop layer is formed on the silicate glass layer.

The method of the present invention forms a compliant buffer layer over a transistor structure to reduce the effect that a relatively highly stressed film, which is formed on the buffer layer, has on that structure. Transistor structures of opposite polarity respond differently to stresses applied to their channel regions. Forming a buffer layer over a transistor structure of one conductivity type, while selectively removing that layer over a transistor structure of the opposite conductivity type, enables one transistor structure to benefit from the stress induced by the highly stressed film while preventing that film from significantly degrading the performance of another transistor structure.

In one embodiment, the highly stressed film comprises a silicon nitride layer that is in tension. An NMOS transistor may benefit from the stress that such a film applies to that transistor's channel region. Covering a PMOS transistor with such a film, however, may degrade the performance of that device. Forming a buffer layer over a PMOS transistor, but not over an NMOS transistor, enables the NMOS transistor to benefit from the presence of a tensile silicon nitride layer without degrading the PMOS transistor. Similarly, covering an NMOS transistor with such a buffer layer, but not covering a PMOS transistor, enables the PMOS transistor to benefit from the presence of a compressive layer without degrading the NMOS transistor.

Figure 1:
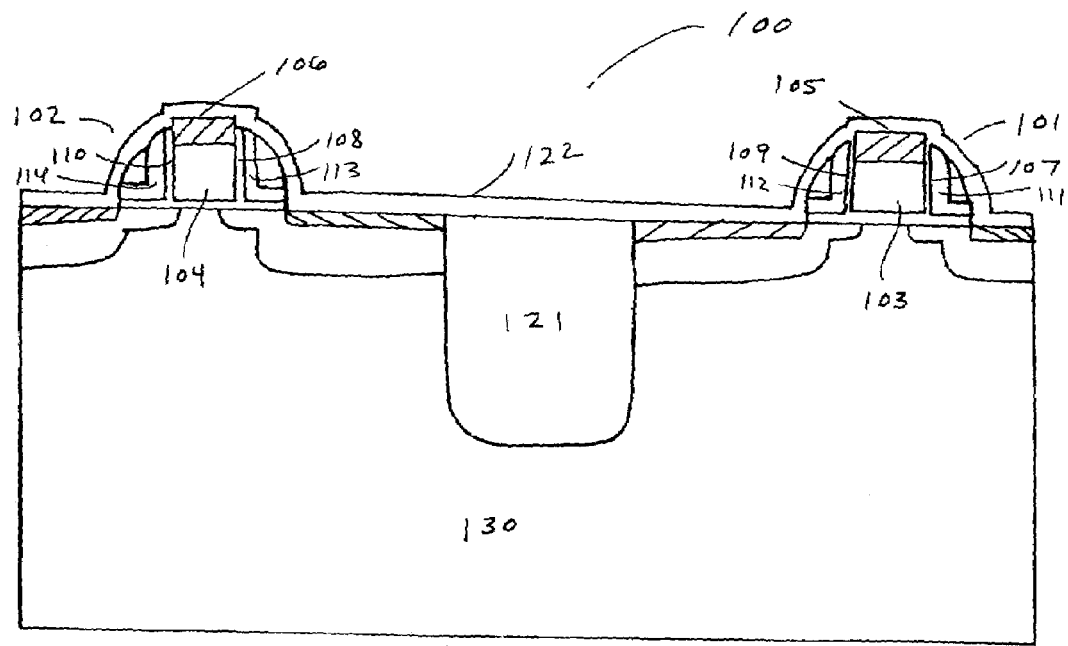
FIG. 1 represents a cross-section of an intermediate structure that may be formed when making the integrated circuit of the present invention.

Although the method of the present invention can be applied to make devices that include either tensile or compressive etch stop layers, FIGS. 1–4 illustrate an embodiment that employs an etch stop layer that is in tension. FIG. 1 represents a cross-section of intermediate structure 100 that may be formed when carrying out that method. That intermediate structure includes PMOS transistor structure 101 and NMOS transistor structure 102, which are formed on semiconductor substrate 130. Adding contacts to structures 101 and 102 will transform them into a PMOS transistor and an NMOS transistor, respectively.

PMOS structure 101 includes gate electrode 103 and NMOS structure 102 includes gate electrode 104. Gate electrodes 103, 104 include top surfaces 105, 106, first side surfaces 107, 108 and second side surfaces 109, 110, respectively. Gate electrodes 103, 104 are each positioned between a source region and a drain region. In this embodiment, gate electrodes 103, 104 are formed on a gate oxide, and comprise polysilicon and a silicide. An oxide layer is formed on each of sides 107, 108, 109, 110 of gate electrodes 103, 104. That oxide layer serves as a stress buffer for a nitride spacer. Nitride spacers 111, 112, 113, 114 are located along sides 107, 108, 109, 110, and on the source and drain regions. The source and drain regions each include a silicide, which is formed on P+ or N+ doped regions. PMOS structure 101 is separated from NMOS structure 102 by shallow trench isolation structure 121.

As illustrated in FIG. 1, silicate glass layer 122 is formed on PMOS structure 101 and NMOS structure 102. Preferably, layer 122 is between about 100 and about 2,000 angstroms thick, and more preferably between about 200 and about 1,000 angstroms thick. In a preferred embodiment, silicate glass layer 122 comprises undoped silicon dioxide, although a doped material, e.g., a phosphosilicate glass (PSG) or borophosphosilicate glass (BSPG), may be used instead. Intermediate structure 100 may be made using conventional equipment, materials, and process steps, as is well understood by those skilled in the art. In this regard, silicate glass layer 122 may be formed using a conventional plasma enhanced chemical vapor deposition ("PECVD"), atmospheric pressure CVD ("APCVD") or low pressure CVD ("LPCVD") process.

Figure 2:
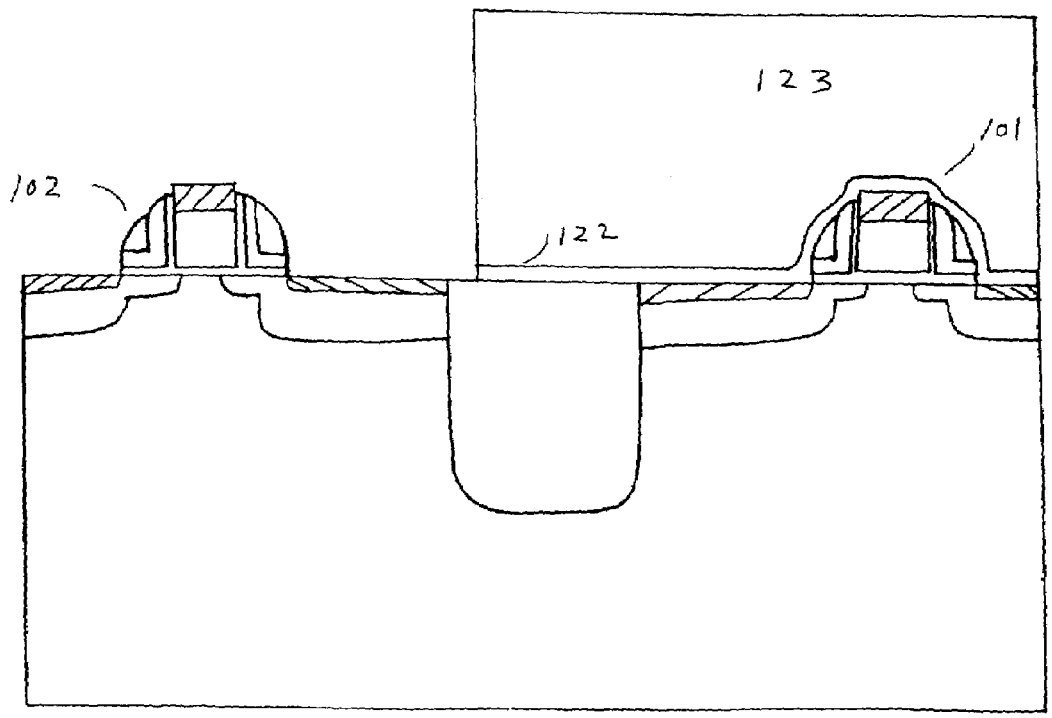
FIG. 2 represents a cross-section of the structure shown in FIG. 1 after part of a silicate glass layer has been removed from it.

After forming silicate glass layer 122, that layer is removed where it covers NMOS structure 102, generating the FIG. 2 structure. To remove that part of layer 122, layer 122 is masked with photoresist 123 where it covers PMOS structure 101 (e.g., using an existing well mask and a conventional lithography process). The exposed part of layer 122 is then removed using a conventional etching process.

Figure 3:
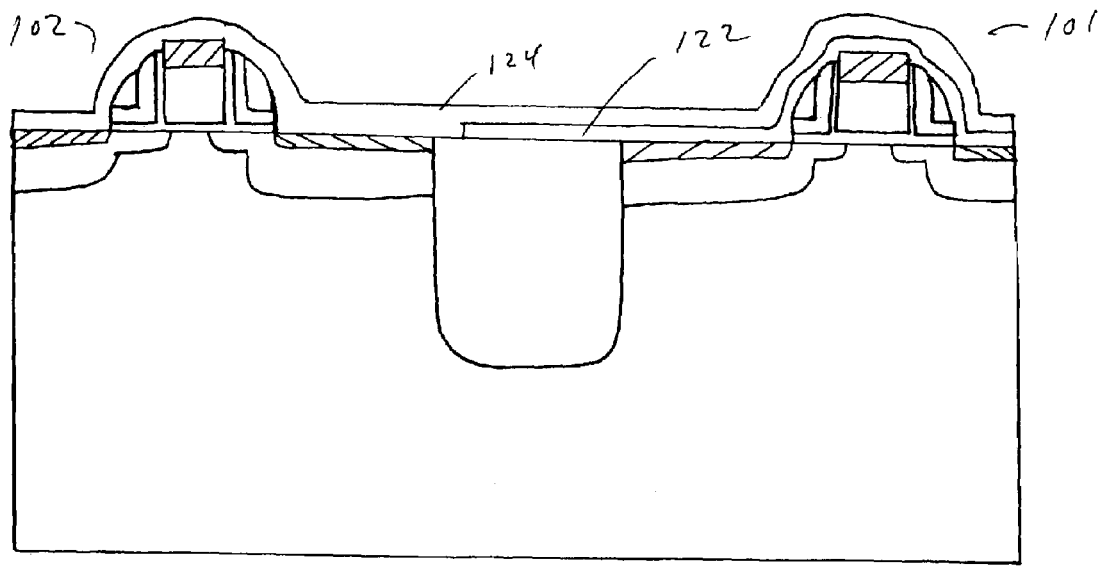
FIG. 3 represents a cross-section of the structure shown in FIG. 2 after an etch stop layer has been formed on it.

After removing silicate glass layer 122, where it covered NMOS structure 102, etch stop layer 124 is formed on PMOS structure 101 and NMOS structure 102, as shown in FIG. 3. Layer 124 preferably comprises a tensile silicon nitride layer, which may be deposited onto silicate glass layer 122 using conventional techniques. In this embodiment of the present invention, layer 124 preferably is between about 100 and about 1,500 angstroms thick, and more preferably between about 200 and about 500 angstroms thick.

Tensile etch stop layer 124 induces a tensile stress in the NMOS transistor channel, which may serve to increase the NMOS drive current. The presence of such a tensile etch stop layer would normally cause drive current degradation for the PMOS device. Because, however, silicate glass layer 122 acts as a buffer layer that reduces stress transfer from etch stop layer 124 to the PMOS structure's channel region, layer 122 serves to minimize any adverse affect that layer 124 may have on the PMOS device's performance. Forming silicate glass layer 122 between PMOS structure 101 and etch stop layer 124 thus enables layer 124 to enhance NMOS transistor performance without degrading PMOS transistor performance.

The stress that a tensile etch stop layer may induce in the channel of an NMOS transistor may be increased by increasing the intrinsic tensile stress in the etch stop layer, or by increasing that layer's thickness. The "pulling effect" of that layer from opposite sides of the gate electrode may be limited, however, because the film is continuous. An optional embodiment of the method of the present invention promotes increased tensile stress transfer from etch stop layer 124 to the NMOS transistor channel by removing etch stop layer 124 from top surface 106 of gate electrode 104, while retaining that layer along side surfaces 108, 110, on nitride spacers 113, 114 and on the source and drain regions.

Figure 4:
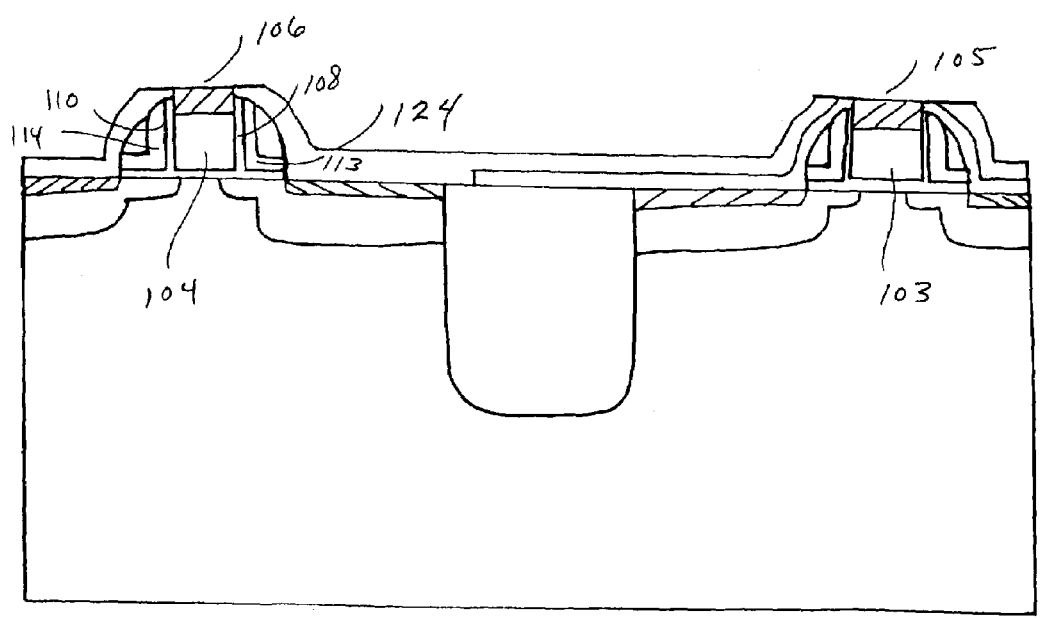
FIG. 4 represents a cross-section of the structure shown in FIG. 3 after part of the etch stop layer has been removed.

As illustrated in FIG. 4, after etch stop layer 124 is deposited, the portions of that layer that lie on top surfaces 105, 106 of gate electrodes 103, 104 may be removed. A conventional chemical mechanical polishing process may be used to remove etch stop layer 124 from top surfaces 105, 106 of gate electrodes 103, 104. Removing the etch stop layer from the top of the gate electrode eliminates the "bridge" that connects sections of that layer, which are located on opposite sides of the gate electrode, enabling those sections to contract more freely. That, in turn, enables them to pull more efficiently on the channel, which increases lateral tension.

After removing etch stop layer 124 from the top of the gate electrodes, conventional process steps for completing the transistors may follow, e.g., forming contacts through an intermetal dielectric layer. As those skilled in the art are familiar with steps that may be performed to generate NMOS and PMOS transistors from the FIG. 4 structure, additional detail related to such process steps will not be provided here.

In the embodiment described above, silicate glass layer 122 is formed on PMOS structure 101 to reduce the adverse effect that tensile layer 124 may otherwise have on that structure. In alternative embodiments, in which layer 124 is instead under compressive stress, silicate glass layer 122 may be formed on NMOS structure 102, while being removed from PMOS structure 101, to reduce the adverse effect that the compressive layer may otherwise have on NMOS structure 102. The method of the present invention thus may be applied to enable the etch stop layer to enhance performance of an NMOS transistor or a PMOS transistor (depending upon whether the etch stop layer applies a tensile or compressive stress on the channel) without degrading performance of the other type of transistor.

Features shown in the above referenced drawings are not intended to be drawn to scale, nor are they intended to be shown in precise positional relationship. Additional process steps that may be used to make the embodiments described above have been omitted when not useful to describe aspects of the present invention.

Although the foregoing description has specified an integrated circuit that includes certain features, and has specified certain materials and process steps that may be included in the above described method, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for forming an integrated circuit comprising:
   forming a PMOS transistor structure and an NMOS transistor structure on a semiconductor substrate;
   forming a silicate glass buffer layer on only the PMOS transistor structure or the NMOS transistor structure; and
   forming and retaining a highly stressed etch stop layer on the silicate glass buffer layer and on both the PMOS transistor structure and the NMOS transistor structure, wherein the silicate glass buffer layer reduces stress transfer from the etch stop layer to the PMOS or NMOS transistor structure upon which the buffer layer is formed.

2. The method of claim 1 wherein the etch stop layer is in tension and the silicate glass layer is formed on the PMOS transistor structure.

3. The method of claim 1 wherein the etch stop layer is in compression and the silicate glass layer is formed on the NMOS transistor structure.

4. The method of claim 1 wherein the silicate glass layer has a thickness of between about 100 and about 2,000 angstroms and comprises a silicon dioxide layer.

5. The method of claim 2 further comprising:
   forming a gate electrode that has a top surface, a first side surface and a second side surface, the gate electrode positioned between a source region and a drain region;
   forming first and second spacers along the first and second side surfaces and on the source and drain regions;
   forming the etch stop layer on the first and second spacers, on the source and drain regions, and on the top surface of the gate electrode; and
   removing the etch stop layer from the top surface of the gate electrode.

6. The method of claim 5 wherein the etch stop layer is removed from the top surface of the gate electrode using a chemical mechanical polishing process.

7. The method of claim 6 wherein the etch stop layer has a thickness of between about 100 and about 1,500 angstroms and comprises silicon nitride.

8. A method for forming an integrated circuit comprising:
   forming a PMOS transistor structure and an NMOS transistor structure on a semiconductor substrate, the NMOS transistor structure having a gate electrode that has a top surface, a first side surface and a second side surface;

forming a silicate glass buffer layer on only the PMOS transistor structure;

forming a highly stressed etch stop layer on the silicate glass buffer layer and along the first side surface and the second side surface of the gate electrode, and on the top surface of the gate electrode; and removing the etch stop layer from the top surface of the gate electrode, while retaining the etch stop layer along the first side surface and along the second side surface of the gate electrode, and retaining the etch stop layer on the silicate glass buffer layer, wherein the highly stressed etch stop layer transfers stress to the NMOS transistor structure, and wherein the silicate glass buffer layer reduces stress transfer from the etch stop layer to the PMOS transistor structure.

9. The method of claim 8 wherein the etch stop layer is removed from the top surface of the gate electrodes using a chemical mechanical polishing process.

10. The method of claim 8 wherein the silicate glass layer has a thickness of between about 100 and about 2,000 angstroms and comprises silicon dioxide.

11. The method of claim 8 wherein the etch stop layer has a thickness of between about 100 and about 1,500 angstroms and comprises silicon nitride.

12. The method of claim 8 wherein the silicate glass layer is formed on only the PMOS transistor structure by forming the silicate glass layer on both the PMOS transistor structure and the NMOS transistor structure, masking the silicate glass layer where it covers the PMOS transistor structure, and removing the silicate glass layer where it covers the NMOS transistor structure.

* * * * *